United States Patent [19]

Chandler

[11] Patent Number: 4,735,220
[45] Date of Patent: Apr. 5, 1988

[54] TURNTABLE HAVING SUPERSTRUCTURE FOR HOLDING WAFER BASKETS

[76] Inventor: Don G. Chandler, 206 Pine St., Lake Jackson, Tex. 77566

[21] Appl. No.: 467,096

[22] Filed: Apr. 13, 1983

[51] Int. Cl.$^4$ ............................................. B08B 3/02
[52] U.S. Cl. ...................................... 134/145; 34/58; 134/149; 134/151
[58] Field of Search ............... 134/145, 149, 151, 153, 134/178; 34/58; 239/214; D24/22

[56] References Cited

U.S. PATENT DOCUMENTS

| | | | |
|---|---|---|---|
| 3,489,608 | 1/1970 | Jacobs et al. | 134/149 X |
| 3,769,992 | 11/1973 | Wallestad | 134/153 X |
| 3,923,156 | 12/1975 | Wallestad | 206/454 |
| 3,990,462 | 11/1976 | Elftmann et al. | 134/102 |
| 4,148,733 | 4/1979 | Gamble | 34/58 X |
| 4,161,356 | 7/1979 | Giffin et al. | 134/149 X |

FOREIGN PATENT DOCUMENTS

| | | | |
|---|---|---|---|
| 668962 | 12/1938 | Fed. Rep. of Germany | 34/58 |
| 249840 | 7/1947 | Switzerland | 134/151 |
| 201005 | 8/1967 | U.S.S.R. | 134/145 |

*Primary Examiner*—Renee S. Luebke

[57] ABSTRACT

A non-metallic turntable having a superstructure with means for holding wafer baskets or specimen holders during centrifugal treatment thereof is comprised of at least one flat annular ring member affixed by posts in a spaced-apart, parallel relationship to a base member which is mountable on a spinning mechanism in a centrifuge. An optional, but convenient, fluid distribution means is provided by passageways in the base member which communicate with hollow portions of the posts, which are equipped with means for spraying fluids therefrom.

20 Claims, 4 Drawing Sheets

TURNTABLE HAVING SUPERSTRUCTURE FOR HOLDING WAFER BASKETS

BACKGROUND OF THE INVENTION

There is a perceived need for non-metallic turntables having superstructures which possess appropriate chemical inertness and also have the physical integrity to withstand the stresses encountered when articles, such as ceramic, glass, metal, or silicon wafers, are affixed thereto for centrifugal treatment, sometimes at elevated temperatures which are at, or near, the boiling point of water.

A particular instance of such cnetrifugal treatment is found in the art of chemical-etching or acid etching and processing of silicon wafers, and the like, wherein a plurality of wafers are inserted in slotted baskets and the baskets are lodged in turntable compartments for the centrifugal treatment of the wafers. This technique of centrifugal treatment of such wafers is disclosed in detail in, e.g., U.S. Pat. No. 3,990,462 and U.S. Pat. No. 4,132,567. In these patents the portions of the superstructure which hold the wafer baskets during centrifugal treatment are illustrated as vertically-disposed compartments affixed to, and mounted between, a horizontal circular turntable base and an annular ring at the top. These prior art turntables are equipped with conduits for spraying fluids during the acid treatment and rinse cycle.

Wafer baskets of interest which may be used in turntables such as described in the above named prior art patents, as well as in my present invention, are baskets such as are disclosed in U.S. Pat. Nos. 3,923,156; 3,923,191; 3,926,305; 3,939,973; 3,961,877; and the like. One of the advantages of my present invention is that my novel concept for a superstructure on the turntable is easily adapted to various sizes and shapes of wafer baskets, as well as to various sizes of centrifuges.

Some of the turntables used in the industry have been made of metal which has been coated with a plastic, such as fluoropolymer, to avoid having the metal come into contact with the treating fluids, some of which are highly corrosive. Even very small amounts of metal contaminants or other foreign material in the treating fluids are usually very detrimental. At times the brittle wafers are found to break or disintegrate during centrifugal treatment, sending small pieces (like missiles) into destructive contact with the plastic-coated metal, thereby exposing a portion of the metal to the corrosive fluids and contaminating the fluids, which are usually recycled for further use.

SUMMARY OF THE INVENTION

A non-metallic turntable device which has a superstructure suitable for holding wafer baskets or other specimen holders during the centrifugal treatment of said wafers or specimens is comprised of a circular base member and an upper annular member, optionally having at least one middle annular member between the base member and the upper annular member, said annular member(s) being mounted parallel to the base in spaced-apart relationship and arranged concentrically with an axis which is normal to the center of said base, the spaced-apart relationship of annular member(s) being maintained by a plurality of posts which extend from the base to the upper annular member. The annular member(s) is (are) provided with means for holding wafer baskets, or other such specimen holders, in position for the treatment of said wafers or specimens, including centrifugal treatment thereof.

FIGS. 1-16 are provided to depict certain embodiments of the present invention. The "annular members" referred to may be considered as being solid (3-dimensional) toroids in shape. When viewed in section, the planar (2-dimensional) shape may be that of an elongate rectangle, elongate flattened oval, narrow wedge, or any shape which will provide a thick flat ring wherein the thickness is only a small fraction of the width.

The figures are described more completely hereinafter.

DETAILED DESCRIPTIONS

Figure 1:
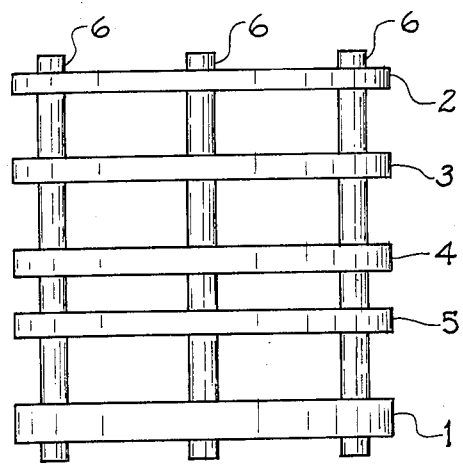
FIG. 1, not to scale, depicts an elevation view of an embodiment having three middle annular members between the base and the upper annular member.

Referring to FIG. 1, there is shown a base (1), an upper annular member (2), and middle annular members (3), (4), and (5). The annular members are held in place, with respect to the base, and to each other by distances appropriate to the size and shape of the wafer baskets, or other specimen holders, which are intended for use with the turntable. The annular members are parallel to the base and to each other and are concentrically mounted with respect to an axis normal to the center of the base.

Figure 2:
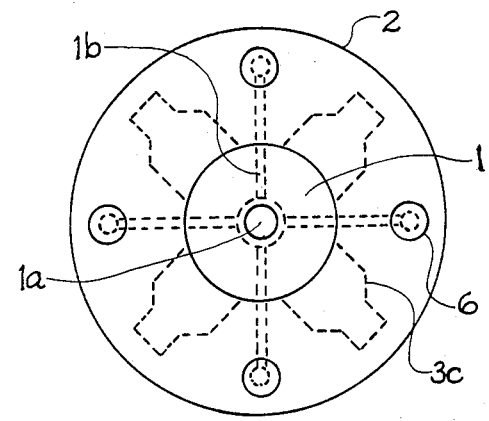
FIG. 2, not to scale, depicts a top view of an embodiment such as shown in FIG. 1.

FIG. 2 depicts a top view of upper annular member (2) with four posts (6). The dotted line circle shown in each post (6) demonstrates an embodiment wherein the posts are hollow below the top of the posts. Dotted lines (3c) demonstrate the presence of a notched annular member (3) below the upper annular member (2). The base (1) is depicted as having a spindle or axle hole (1a) at its center.

Figure 3:
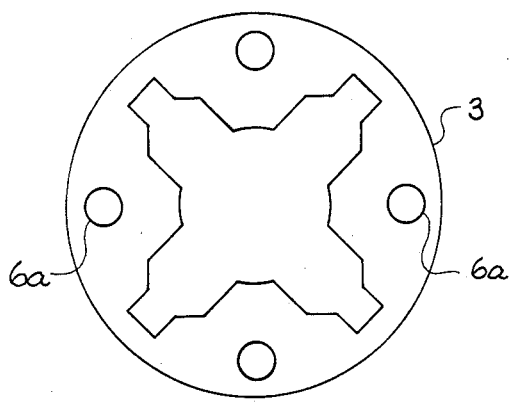
FIG. 3, not to scale, depicts a top view of an embodiment of a middle annular member showing notched-out portions for holding wafer baskets or other specimen holders, such as shown in FIG. 1.

FIG. 3 depicts a notched annular member (3) and shows four holes (6a) for positioning of posts. This view also can be said to represent annular members (3) and (4) of FIG. 1.

Figure 4:
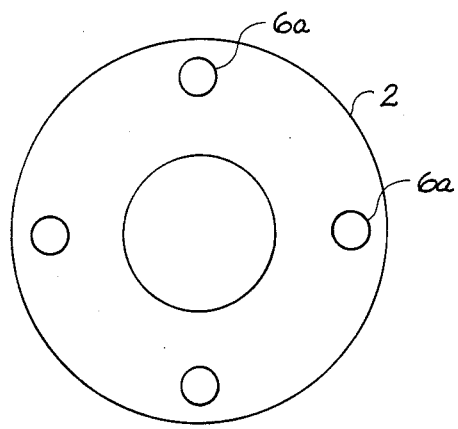
FIG. 4, not to scale, depicts an annular member suitable for use as an upper annular member (2) and/or for use as a lower annular member (5) such as shown in FIG. 1.

FIG. 4 depicts a top view of upper annular member (2) and shows four holes (6a) for positioning of posts. This same kind of annular member can be used as annular member (5) of FIG. 1.

Figure 5:
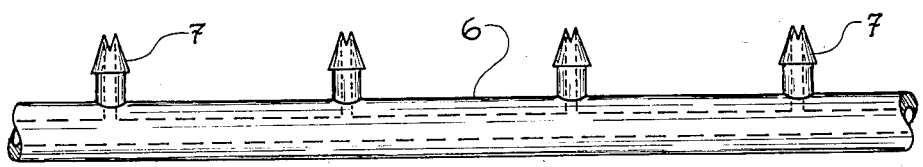
FIG. 5, not to scale, depicts a cutaway view of a post such as may be used in certain embodiments, whereby the post is hollow and is fitted with nozzles.

FIG. 5 depicts a cutaway section of post (6) which is hollow, as indicated by dotted lines, and demonstrates attachment of nozzles which communicate with the hollow portion of the posts.

Figure 6:
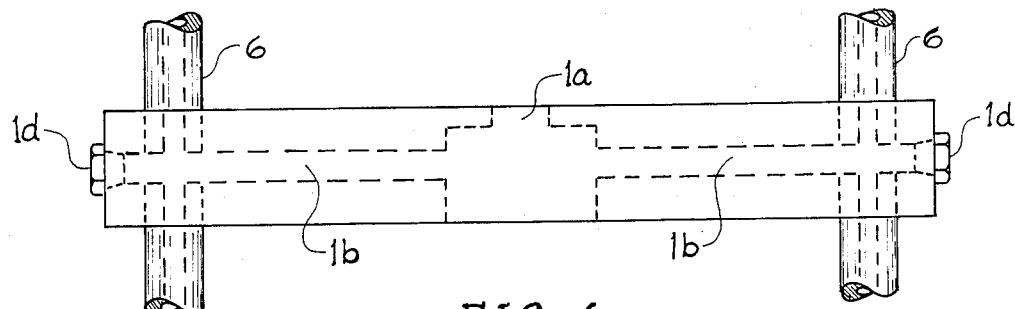
FIG. 6, not to scale, depicts a base having a centrally located opening for mounting on a spindle, said opening communicating through passageways to hollow posts extending through said base.

FIG. 6 depicts a base (1) having a centrally-located hole (1a) for attachment to a spindle. The spindle hole (1a) is shown as having a widened portion suitable for receiving a rotary attachment whereby a flow of fluid can be carried by passageways (1b) to hollow portions of posts (6). From posts (6) fluids can be conveyed through appropriately located nozzles or spray means, such as in FIG. 5, for distribution of fluid within the tub or compartment within which the turntable is mounted. As shown in FIG. 6, the passageways (1b), if they extend through the outer peripheral surface of base (1), can be blocked off by use of plugs (1d) or, if desired, can be fitted with nozzles or other spray means to obtain additional distribution of fluids.

Figure 7:
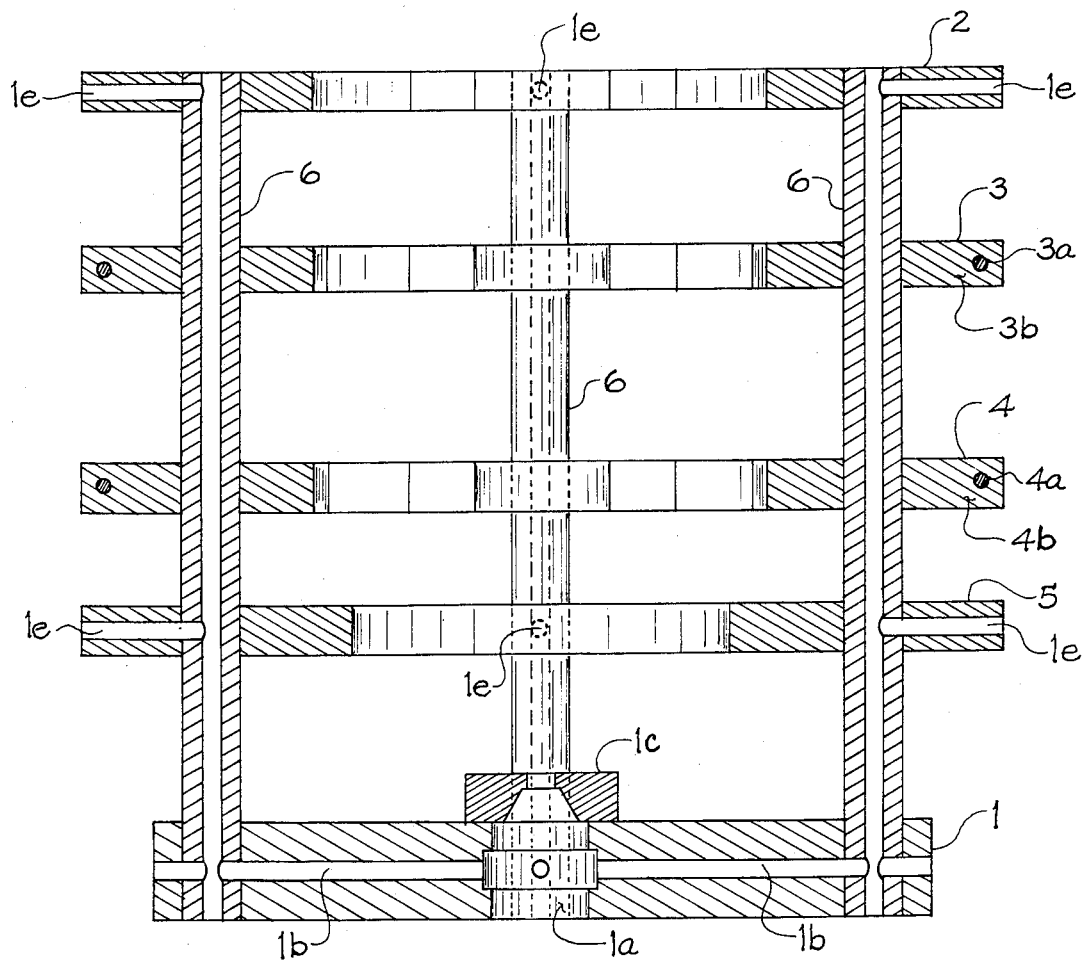
FIG. 7, not to scale, depicts an elevation view of a turntable and superstructure in half-cutaway cross section.

FIG. 7 is a half-cutaway cross-sectional elevation view of an embodiment, quite similar to FIG. 1, where upper annular members (2), (3), (4), and (5) are cross-sectioned through their middles, base member (1) is cross-sectioned at its middle to reveal passageways (1b) and hollow posts (6) are shown in cross-section except for the post (6) which is viewed at the rear middle of the elevation. The said middle post (6) is shown by dotted lines at the bottom of the view, behind area (1a), to extend to the bottom of base member (1). Also in FIG. 7 there is shown the cutaway cross-sectioned views of reinforcement means (3a) and (4a) to provide extra strength for the members where the width of the members is reduced by being notched. Note that in FIG. 7 the passageways (1b) are shown as communicating with hollow portions of posts (6). It is within the purview of the present invention to provide nozzles or other fluid distribution means along posts (6) to communicate with the hollow portions of the posts and also to provide, if desired, nozzles or fluid distribution means at the ends of posts (6). It is possible, and in some instances may be desirable, to use nozzles at the outer extremities of passageways (1b) or alternately the said outer extremities can be plugged. One convenient manner of providing passageways (1b) in the base member (1) is to drill inwardly to the area (1a) and the, if no nozzle is desired at the outer extremities of passageway (1b), the holes can be plugged. A hub reinforcement means (1c) is conveniently used as an integral part of base member (1) where the axle is positioned in hole (1a) for spinning the turntable. Fluid passageways (1e) are shown in communication with passageways (1b) which are in the base (1) and posts (6).

Figure 8:
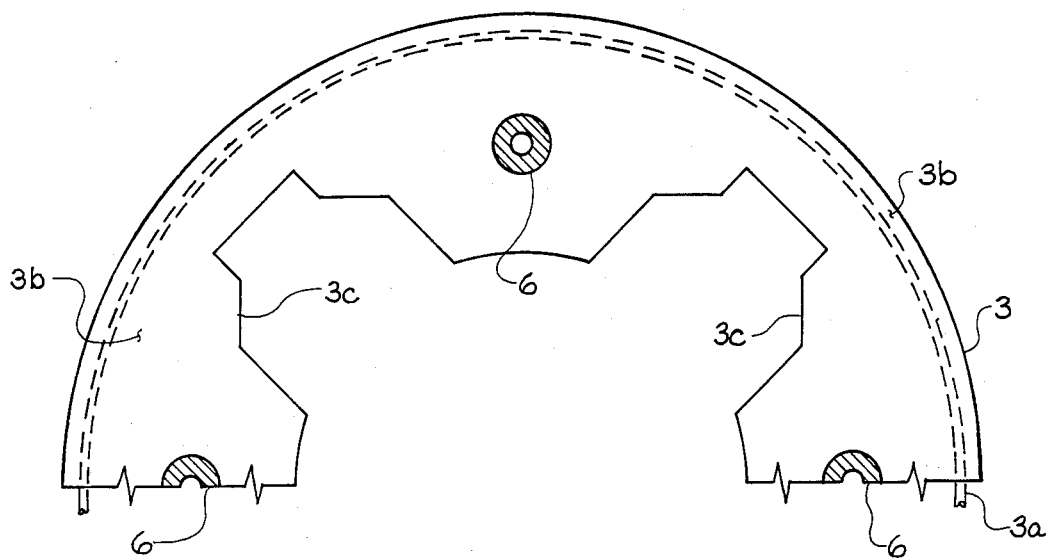
FIG. 8, not to scale, depicts a top view of a middle annular member such as in FIG. 7, showing notched-out portions for receiving wafer baskets or other specimen holders.

FIG. 8 provides a top view of a half-cutaway of annular member (3) such as depicted in elevation in FIG. 7. In FIG. 8 the dotted lines near the outer periphery indicate reinforcement means (3a), also shown protruding, which can be provided to strengthen that portion (3b) of annular member (3) which is reduced in width because of the notched out portions. In FIG. 8 there are depicted two of the four notched out portions which would be present if the entire top view were shown, such as in FIG. 3. This view also can be said to be a view of annular member (4) of FIG. 7.

Also notice in the embodiment depicted in FIG. 7 that the lower annular member (5) is shown as having a smaller inner radius than the annular members above it. This extra width of the surface of annular member (5) provides a wider shflt on which wafer baskets may be placed when they are positioned within the notched out portions of annular members (3) and (4). The wafer baskets may, however, be designed in a manner such that the wider shelf area provided by annular member (5) is not needed. Further notice in FIG. 7 that the diameter of the base is shown as being less than that of the annular members; this is to illustrate that not all the members of the turntable must be of exactly the same diameter, though they preferably will be fairly close to the same diameter.

Figure 9:
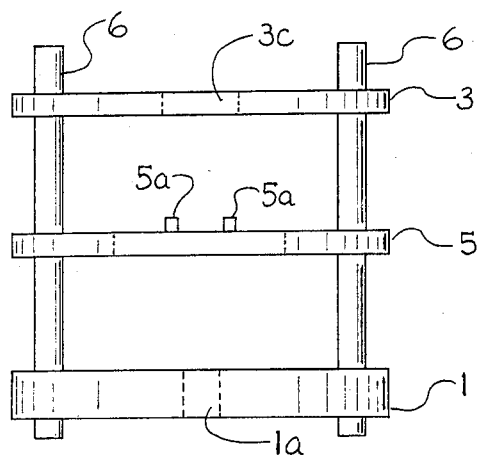
FIG. 9, not to scale, is an illustration of a turntable in which the superstructure mounted onto a base by vertical posts comprises an upper notched annular ring and a middle annular ring having chock means protruding from its upper surface.

FIG. 9 is an illustration of an embodiment wherein the base member (1) has a superstructure comprising an upper annular ring (3) and a middle annular ring (5) held in position by posts (6) to illustrate the use of chock members (5a) mounted on annular ring (5) directly below notched out portion (3c) of annular ring (3). The use of such chocks on annular ring (5), with annular ring 95) being a "shelf" member on which the sample holders or wafer baskets will rest when positioned within the notched portion of annular ring (3), provide a means for preventing the lower end of the sample holders or wafer baskets from slipping outwardly when the turntable is spinning. The posts (6), while shown as extending below base (1) and above ring (3), are not necessarily so-extended in all embodiments of the present concept. The posts (6) may be provided with liquid spray means at selected locations along their length, including positions below base (1) and/or above ring (3). Provision of liquid distribution through the posts (6) may be provided, e.g., as shown in FIGS. 5, 6, and 7. The liquid passageways (1b) such as shown in base (1) of FIG. 7 may also be employed with hollow posts (6) by providing the same kind of passageways in ring (5) and/or ring (3) which communicate with the hollow portion of post (6) to the edge of the annular rings.

Figure 10:
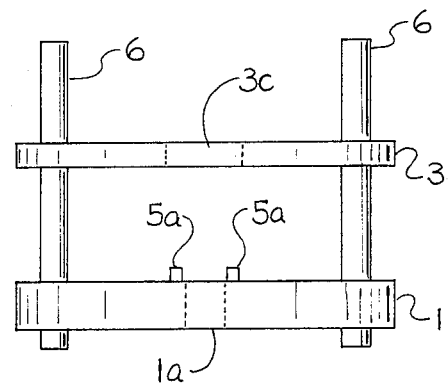
FIG. 10, not to scale, is similar to FIG. 9 except that there is no middle annular ring between the notched annular ring and the base; the chock means protrude from the upper surface of the base.

FIG. 10 is an illustration of the use of chocks (5a) such as in FIG. 9, except that the chocks (5a) are positioned directly on base member (1). Thus FIG. 10 is an illustration of an embodiment whereby the superstructure of the turntable comprises a single annular ring member (3) supported above the base member (1) by posts (6). In this embodiment the sample holders or wafer baskets are positioned in the notched portions (3c) of annular ring (3) and rest upon the base (1), with the chock means (5a) serving to prevent the sample holder or wafer basket from being moved outwardly when the superstructure is spinning. The same explanations of liquid distribution embodiments as discussed above with respect to FIG. 9 are applicable in FIG. 10.

Figure 11:
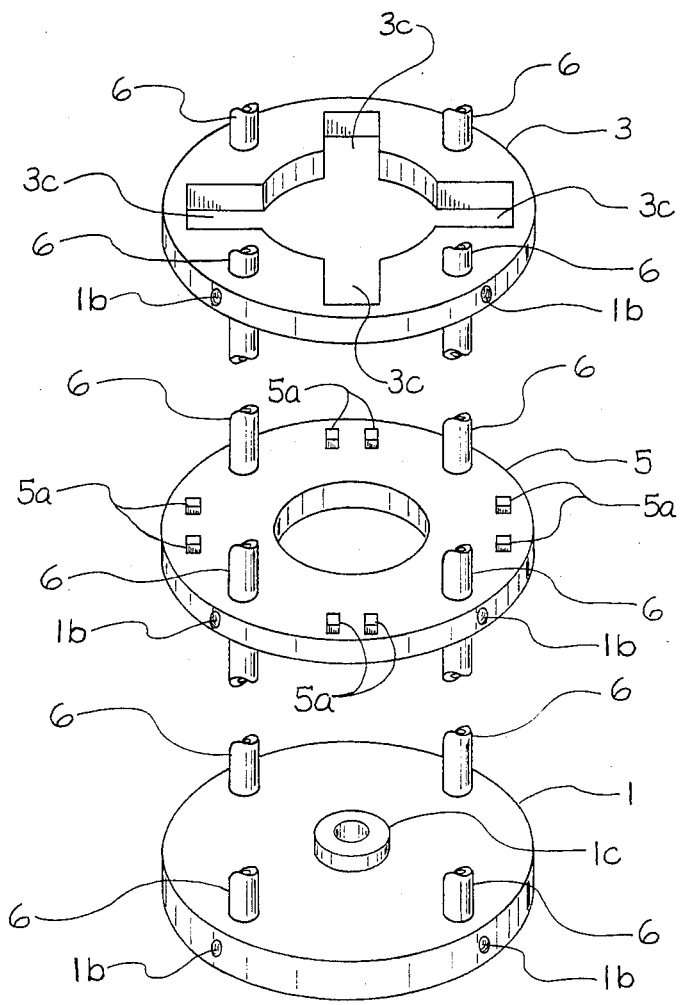
FIG. 11, not to scale, is an exploded, supra-oblique view to more fully depict an embodiment such as shown in FIG. 9, wherein only one notched annular ring is used in cooperation with chock means located on a lower surface.

FIG. 11 is an exploded, supra-oblique view of the type of embodiment illustrated in FIG. 9, but in greater detail. The posts (6) are partially cut away to provide a clearer view of the other portions. Chock means (5a) on annular ring (5) are located beneath corresponding notched portions (3c) of the upper annular ring (3) for cooperation therewith in holding the sample holders or wafer baskets in place as the turntable is spinning. Also shown in FIG. 11 is the use of passageways (1b) to communicate with hollow posts (6) in the base member (1) and also in annular rings (5) and (3). In FIG. 11 the central opening of annular ring (5) is not as wide as the central opening of annular ring (3); this is to provide a greater "shelf" area for supporting the sample holders or wafer baskets.

Whereas the particular embodiments illustrated in FIGS. 1 through 11 are especially suited for holding wafer baskets such as are described in patents referred to herein above, the present novel arrangement of annular members mounted as a superstructure on a revolvable base readily lends itself to provision of other embodiments, without departing from the novel concept which forms the purview of the present invention.

Embodiments which have only the upper annular member (2) and only one middle annular member (3) as the annular members of the superstructure are within the purview of the present concept. The number of notches or other means for positioning wafer baskets or other specimen holders may be virtually any number, so long as appropriate weight balancing adequate for centrifuging is provided. The principal limiting factors which determine the number, shape, and size of the notches, or other means for specimen holders, are the size of the specimen holders and the size of the centrifuge apparatus for which the present turntable is designed. The number of notches is generally from 2 to 8, evenly spaced apart.

The number of posts (6) used in holding the annular member(s) in spaced-apart parallel relationship to base (1) should be at least two, preferably four, but can be any plural number which can be operably positioned between the notches in annular member(s) (3). The posts are not required, in all instances, to be hollow, but having them hollow provides a convenient manner in which fluid distribution means or nozzles can be positioned, if desired, to supply chemicals and/or rinse water to the turntable and/or to the tub or centrifuge apparatus in which the turntable is mounted. The posts are not limited to those which are round, as they may also be ovate or polygonal as viewed in cross-section.

The non-metallic material is conveniently a material which can be molded and/or machined to the desired dimensions. There are some inorganic ceramic materials or glasses which are suitable in some applications. By "non-metallic" it is meant that the turntable is prepared of material which cannot expose metal to the liquids used in conjunction therewith, even though the turntable may become chipped or cracked during use. Any of the instant non-metallic structures may be constructed with metal parts so deeply embedded or protected from possible exposure to the liquids used, even when chips or cracks may occur, are considered here as being essentially "non-metallic" and as being within the purview of the present invention. Of special interest as the material of construction in the present invention are synthetic polymers or resins which are solid and have a high degree of rigidity when prepared using dimensions appropriate to the intended use of the present novel turntables. Thermoplastic polymers or resins can be thermoformed, extruded, molded and/or shaped to the desired dimensions and configurations to form the annular members, the base member, and the post members. The various members can also be prepared by casting thermosetting resins or plastics in molds.

It is generally preferablye to make the edges of the annular members chamfered, rounded, or curved, especially where the inside vertical peripheral surface of the member meets with horizontal surfaces of the same member. This helps in shedding water or other fluids from the inside surface of the member during centrifuging. This rounding of the inner vertical surface can be done by machining the member after having been molded or prepared, or can be formed during molding.

The plastics or resins used in preparing the members of the turntable may be polyolefins, such as, e.g., polyethylene or polypropylene; ethylene copolymer; polyvinyls; polyacrylates, such as, e.g., polymethylmethacrylate; fluoropolymers, such as, e.g., polytetrafluoroethylenes or polychlorofluoroethylenes; polyvinylidenefluoride; other polyhaloolefins; polycarbonate; polyesters; polyepoxides; and the like. The particular choice of plastics or resin is generally decided on the basis of the need for inertness to the chemical or substances involved in the centrifugal treatment and/or the temperature stability needed, as well as costs, availability, and resistance to flow or creep under the physical conditions to which it is to be subjected.

The principal structural requirement is that the non-metallic material, e.g., plastic or resin, be inert enough, rigid enough and strong enough to withstand the conditions and forces of the particular centrifugal treatment in which it is to be used as members of the present turntable.

Preferably, polyolefins, (esp. highly crystalline polypropylene, high density polyethylene, and linear polyethylene), fluoropolymers (esp. polytetrafluoroethylene, polyvinylidenefluoride, PFA, TFA, and polychlorofluoroethylene) are used because of their stability to hot water, their rigidity, and their high degree of inertness to strong aqueous acids. If contact with an organic or hydrocarbon solvent is to be expected of the present turntable, then the fluoropolymers are preferred. Polychlorotrifluoroethylene is usually a good choice due to its chemical inertness, strength, and processability. Other halopolymers which may be used in many applications are polyvinylchloride, polyvinylfluoride, polyvinylidenechloride, polyvinylidene fluoride, fluorinated ethylenepropylene copolymers, and the like.

A number of convenient means may be used in affixing the annular members and the base to the posts which hold them properly spaced apart. Heat-welding, threaded lock-nuts, and wedges in keyslots may be used. Also, one may use space sleeves of appropriate dimensions which fit around the posts but which are positioned only between, not through, the annular members.

In a particular embodiment, designed for use with a particular centrifugal apparatus and having essentially the appearance of the turntable depicted in FIG. 7, the base member is a disc of 16¾ inches diameter and ¾ inch thick, cut from a solid molded piece of rigid plastic. Holes are drilled through the base 7½ inches from the center of the base to receive posts which are about 9¼ inches long. Mounted on the posts about 2 inches above the base is an annular member of about ⅜ inch thickness, about 19 inches outside diameter, and about 11½ inches inside diameter. About 1 inch above that is mounted an annular member, notched to receive wafer baskets, which is ⅜ inch thick, about 19 inches outside diameter, and about 12 inches inside diameter. About 3 inches above that is mounted a second such notched annular member. An upper annular member of the same dimensions, but not having notches, is mounted about 1⅛ inches above said second notched member. The wafer baskets are about 6 inches tall and fit quite well in the notched out annular rings and in between the lower annular ring and the upper annular ring.

In another particular embodiment, designed for use with a particular centrifugal apparatus and being substantially the same type of turntable as depicted in FIGS. 9 and 11, there is provided a base, an upper annular member having eight equi-spaced notched out portions for receiving wafer baskets, a middle annular member having 8 pairs of chocks equi-spaced on its upper surface, and eight posts equi-spaced to hold the annular members in fixed position on the base, thereby forming a base having a superstructure. The chocks are arranged so as to have each pair in a position below a corresponding notch so as to cooperate in holding wafer baskets in position during centrifugal treatment. The diameter of the base and of the annular rings is about 19 inches. The thickness of the base is about ¾ inch. The thickness of the middle annular ring is about ⅜ inch and the inside diameter of the ring is about 11½ inches. The upper annular ring is about ⅜ inch thick and has an inner diameter of about 12 inches. The posts extend from the base through the two annular rings at a distance of about 7½ inches from an axis perpendicular to the center of the base. The distance between the base and the middle annular ring is about 2 inches. The distance between the middle annular ring and the upper annular ring is about 4 inches. The wafer baskets, when installed, rest on the middle annular ring, with their outward (backside) surfaces against the chocks, and nestle snugly within the notched out portions (designed for the baskets) of the upper annular ring. The baskets extend above the upper annular ring about 1½ inches.

The overall dimensions, the dimensions of the individual members, and the number of middle members (between the base and upper members) can be varied to fit the particular application and operation in which the turntable is to be used. The size and shape of the notches and of the chocks are easily designed, within the present concept, to acccomodate various shapes and sizes of wafer baskets or other sample holders.

Turntables of the present design are more streamlined, with respect to air flow during centrifuging, than turntbles which present more vertical surfaces than the vertical posts of the present design. Vertical surfaces tend to produce "fan" effects, similar to so-called "squirrel-cage" fans, thus can produce turbulence within the centrifuge tub which may interfere with even distribution of fluids across the wafers during centrifugal treatment.

It is within the purview of the present invention for the turntables to be made with built-in fluid distribution means, such as shown in the figures, as discussed above, or without built-in fluid distribution means. The rinse water distribution can be provided by stationary means within the tub in the same manner that acid or chemical distribution means can be provided, such as by being attached to the underside of the cover of the centrifuge apparatus.

It can be seen then that within the purview of the present invention there are various embodiments which comprise the use of the superstructures which derive their strength, usefulness, and durability from the novel annular rings attached by vertical posts to a turntable base, the whole providing a non-metallic turntable apparatus for holding wafer baskets, sample holders, and the like during centrifugal treatment thereof. For those embodiments in which only one notched annular ring is employed, the use of chocks, as described herein, provides a convenient and effective method for preventing the bottom of the wafer basket or sample holder from being dislodged or displaced outwardly during centrifugal treatment, whether the chocks are used directly on the base or on an annular ring positioned above the base. A plurality of notched annular rings may be used, in which case the chocks may be dispensed with. The fluid distribution means which can be built into the structure for providing passageways through the base and even through the posts provides useful embodiments in those instances where thorough rinsing of the centrifuge tub is desirable or preferred.

Whereas the foregoing descriptions have dealt largely with the use of notched-out portions of annular rings as the means for holding wafer baskets or other specimen containers during centrifugal treatment thereof, it is also within the purview of the present invention to employ other means such as are illustrated in Figures 12–15.

Figure 12:
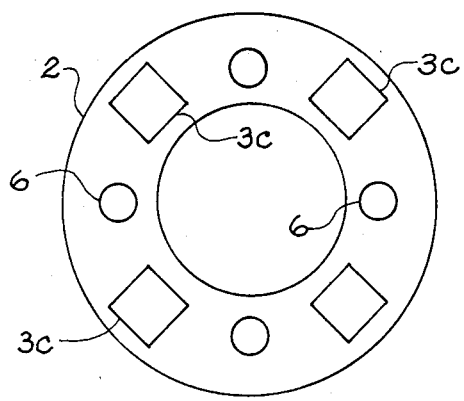
FIG. 12, not to scale, is a top view of a flat annular ring member (2) having a plurality of holes (3c) positioned on the ring between support posts (6). These holes (3c) may be used instead of the notched-out portions such as shown in FIG. 3, as a means of holding wafer baskets or other specimen holders during centrifugal treatment thereof.
Figure 13:
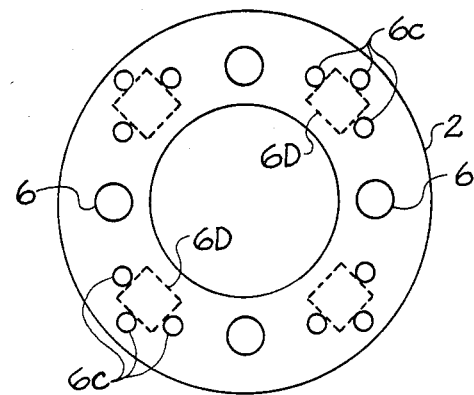
FIG. 13, not to scale, is a top view of a flat annular ring member (2) having groups of pegs or upright members (6c) protruding from the annular ring between support posts (6) and shown as situated amid the groups of pegs, indicated by dotted lines, are the wafer baskets or specimen holders (6d). This provides an alternate means for holding said baskets or holders in place in the annular ring superstructure during centrifugal treatment.

In FIG. 12 it is illustrated that holes may be provided in an annular ring into which a wafer basket or other specimen container may be inserted. In FIG. 13 it is illustrated that wafer baskets or other specimen containers may be held in place during centrifugal treatment by pegs or pins. These pegs or pins may extend from the upper surface of one ring to the lowr surface of another ring, or alternatelyl, may be only long enough to be effective chock means wherein chock means on the upper surface of one ring cooperate with chock means protruding from the lower surface of another ring.

Figure 14:
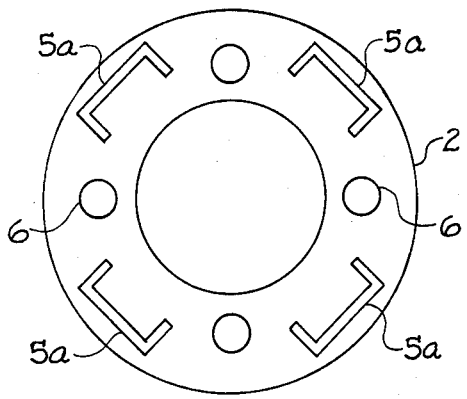
FIG. 14, not to scale, is a top view of a flat annular ring member (2) having chock means (5a) positioned between support posts (6) as an alternate means for holding wafer baskets or specimen holders in place in the annular ring superstructure during centrifugal treatment.

In FIG. 14 it is illustrated that the chock means may take the configuration of a short, three-sided wall protruding from the upper surface of a ring and which can hold the lower portion of a wafer basket or other specimen container in position while the upper portion of the basket or container can be held in place in a notched-out ring, or a ring having holes through which the said baskets or container are inserted, or by corresponding chock means protruding from the lower surface of an upper ring. The present invention is readily applied to various shapes and sizes of baskets or other containers for centrifugal treatment of articles contained therein.

In those embodiments in which pegs, pins, or other chock means are used in holding the baskets or containers in position during centrifuging, it is preferred that the distance between cooperating layers of the superstructure be selected so as to prevent vertical movement of the baskets or conatiners during centrifuging.

It will be understood that the use of chock means for holding one end of a basket or container in position during centrifuging, while holding the other end of said basket or container in a notched-out portion, or in a hole in an annular, or in cooperation which other chock means at the other end, is a feature which is applicable whether the basket or container is held directly between two annular ring members or between the base and an annular ring member.

Figure 15:
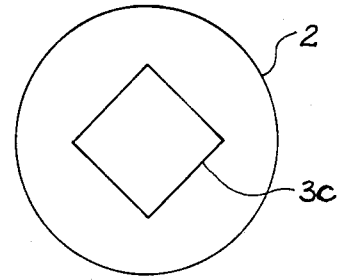
FIG. 15, not to scale, is a top view of a flat annular ring member (2) having a central opening (3c) for holding a wafer basket or specimen holder in those embodiments wherein it is desired to have the articles being treated positioned in the middle of the centrifugal forces.

In FIG. 15 it can be seen that an opening (3c) in an annular ring (2) may be used as a holding means for a basket or other container, with said annular ring being attached by post means, as shown in other figures, to a base member. Such a superstructure provides a strong means for the centrifugal treatment of articles carried in the basket or container.

Figure 16:
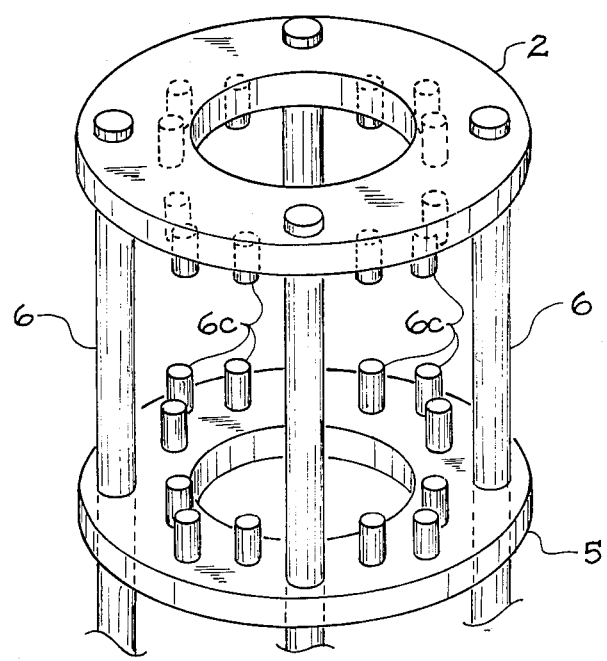
FIG. 16 illustrates the use of pegs such as those shown in FIG. 13.

FIG. 16 illustrates the use of pegs (6c) protruding up from annular member (5) and protruding down from annular member (2). The annular members (2) and (5) are essentially about the same as those of FIG. 1. The pegs (6c) are essentially about the same as those in FIG. 13.

The present invention is readily adaptable to various centrifuges and the means for attaching the base of the present structure to the spindle or shaft of the centrifuge motor is easily designed for adaptation thereto.

Features shown in one of the attached descriptive figures can be employed in combination with features from another of the figures, such as the fluid distribution used in the annular rings of FIG. 11 can be employed in the annular rings of FIG. 7, or the fluid distribution means of FIG. 5 can be used with the structures such as shown in FIGS. 7 and 11.

In the event that greater strength of the rings may be desired as a precaution taken in expectation of relatively high centrifugal speeds, yet with a desire that the weight of the turntable not be substantially increased, then the use of annular rings having a wedge-shape cross-section can be used. In this manner, the thickness of the annular ring may be appreciably thicker at the outer perimeter than it is toward the central opening of the ring. This same wedgedshape can be used to ensure adequate strength at the narrowed portion of notched areas (3b) of the annular rings.

The reinforcing hub member (1c) shown in FIGS. 7 and 11 can be used in the other embodiments of the present invention.

Various modifications may be made without departing from the purview of the present invention. The invention is not limited to only the embodiments disclosed here, but is limited only by the following claims.

I claim:

1. A non-metallic turntable having a superstructure for holding wafer baskets or specimen containers during centrifugal treatment thereof, said turntable comprising in combination
    a non-metallic base member having hub means central thereof for attaching said base in a horizontal position to a rotation means in a centrifuge apparatus,
    at least one non-metallic flat annular ring member mounted onto said base member by a plurality of non-metallic post members which hold said ring in a spaced-apart, parallel relationship to said base member and concentric to an axis which is normal to the base member through the center thereof, and
    holding means provided between said post members for holding wafer baskets or specimen containers in place in the superstructure during centrifugal treatment thereof.

2. The turntable of claim 1 wherein the base member is provided with fluid passageways communicating from its central portion to at least some of the posts, and where at least some of the posts are hollow, with the hollow portions communicating with the said fluid passageways of the base.

3. The turntable of claim 1 wherein the base member and the annular ring contain fluid passageways which communicate with hollow portions in at least one of the posts, said passageways and hollow portions providing means for fluid distribution through the outer edge of said base and/or said annular member.

4. The turntable of claim 1 wherein the base member is provided with fluid passageways communicating from its central portion to at least some of the posts, and whre at least some of the posts are hollow, with the hollow portions communicating with the said fluid passageways of the base,
    further characterized as having spray means communicating with the hollow portions of the posts for distribution of fluids therefrom.

5. The turntable of claim 1, prepared from ceramic, glass, substantially rigid polymer material, or substantially rigid resin material.

6. The turntable of claim 1, prepared from a substantially rigid polymer of olefin material.

7. The turntable of claim 1, prepared from a substantially rigid fluoropolymer.

8. The turntable of claim 1 wherein the holding means for holding wafer baskets or specimen containers in place in the superstructure during centrifugal treatment thereof comprises holes or notched-out portions in said annular ring member which are operable in preventing dislodgement of said baskets or containers by the centrifugal forces encountered.

9. The turntable of claim 1 wherein the holding means for holding wafer baskets or specimen containers in place in the superstructure during centrifugal treatment thereof comprises chocks, cleats, pins, posts, or pegs protruding from the surface of one of the horizontal members toward other such protrusions on the facing surface of another horizontal member.

10. The turntable of claim 1 wherein there is a plurality of flat annular ring members attached to said base member by a plurality of posts, each member of the structure being held in spaced-apart, parallel relationship to each other, and each being concentrically-mounted with respect to an axis normal to the center of the base, the so-formed superstructure being provided with holding means operable to hold wafer baskets or specimen containers in place in the superstructure during centrifugal treatment thereof.

11. A non-metallic turntable having a superstructure for holding wafer baskets or specimen containers during centrifugal treatment thereof, said turntable comprising a non-metallic base member having hub means central thereof for attaching said base in a horizontal positon to a rotation means in a centrifuge apparatus, a non-metallic flat annular ring member mounted onto said base member by a plurality of nonmetallic posts which hold said ring in a spaced-apart, parallel relationship to said base member and concentric to an axis which is normal to the base member through the center thereof, the center of the annular ring being an opening of a shape and dimension to serve as a means for holding said baskets or containers in the middle of the superstructure during centrifugal treatment thereof.

12. The turntable of claim 11 wherein fluid distribution means is provided by passageways which communicate from the central portion of the base member to passageways in the post members, the passageways in the post members further communicating through spray means or other openings to the area around the turntable.

13. A non-metallic turntable having a superstructure for holding wafer baskets or specimen containers during centrifugal treatment thereof, said turntable comprising a non-metallic base member having hub means central thereof for attaching said base in a horizontal position to a rotation means in a centrifuge apparatus, an upper annular ring, at least one middle annular ring, and a lower annular ring, the annular rings being arranged in spaced-apart, parallel relationship, concentric to an axis normal to the center of the base and affixed to the base and to each other by a plurality of posts, with holding means being provided for holding articles in palce between the posts in the superstructure during centrifugal treatment of said articles.

14. The turntable of claim 13 wherein the base member is provided with fluid passageways communicating from its central portion to at least some of the posts, and where at least some of the posts are hollow, with the hollow portions communicating with the said fluid passageways of the base, and further communicating with openings to the area around the turntable.

15. The turntable of claim 13 wherein there are two annular rings between the upper annular ring and the lower annular ring, and wherein the lower annular ring serves as a shelf member onto which the basket, container or other article to be treated is placed during centrifugal treatment thereof, the two middle annular rings being provided with holes or notched-out portions into which the baskets, containers, or other articles to be treated are positioned and held during centrifugal treatment thereof.

16. The turntable of claim 13 wherein the base member and at least one of the annular rings contain fluid passageways which communicate with hollow portions in at least some of the posts, said passagways and hollow portions providing fluid distribution means through the turntable to the area around the turntable by being connected to a fluid source which communicates with the passageways in the base member at the central location thereof.

17. The turntable of claim 13 wherein the means for holding baskets, containers, or other articles to be treated comprises use of the lower annular member as a shelf having chocks,cleats, pegs, pins, or other protrusions from its upper surface which cooperate with holes or notched-out portions in a middle annular ring, thereby serving to hold said baskets, containers, or other articles in position during centrifugal treatment thereof.

18. The turntable of claim 13, prepared from ceramic, glass, substantially rigid polymer material, or substantially rigid resin material.

19. The turntable of claim 13, prepared from a substantially rigid polymer of olefin material.

20. The turntable of claim 13, prepared from a substantially rigid fluoropolymer.

* * * * *